US012787497B2

(12) United States Patent
Richter et al.

(10) Patent No.: US 12,787,497 B2
(45) Date of Patent: Nov. 3, 2026

(54) OPTOELECTRONIC SEMICONDUCTOR ELEMENT AND OPTOELECTRONIC COMPONENT

(71) Applicant: ams-OSRAM International GmbH, Regensburg (DE)

(72) Inventors: Daniel Richter, Bad Abbach (DE); Gunnar Petersen, Regensburg (DE); Simon Schwalenberg, Brennberg (DE)

(73) Assignee: ams-OSRAM International GmbH, Regensburg (DE)

( * ) Notice: Subject to any disclaimer, the term of this patent is extended or adjusted under 35 U.S.C. 154(b) by 340 days.

(21) Appl. No.: 18/290,814

(22) PCT Filed: Jun. 22, 2022

(86) PCT No.: PCT/EP2022/066952
§ 371 (c)(1),
(2) Date: Jan. 22, 2024

(87) PCT Pub. No.: WO2023/001469
PCT Pub. Date: Jan. 26, 2023

(65) Prior Publication Data

US 2025/0113657 A1 Apr. 3, 2025

(30) Foreign Application Priority Data

Jul. 22, 2021 (DE) ..................... 10 2021 119 003.7

(51) Int. Cl.
*H10H 20/814* (2025.01)
*H10H 20/851* (2025.01)

(52) U.S. Cl.
CPC ...... *H10H 20/814* (2025.01); *H10H 20/8514* (2025.01)

(58) Field of Classification Search
CPC ........................... H10H 20/814; H10H 20/841
See application file for complete search history.

(56) References Cited

U.S. PATENT DOCUMENTS 8,162,500 B2 * 4/2012 Kim .................. G02F 1/133605 362/249.02
2004/0145895 A1 * 7/2004 Ouderkirk .......... H10H 20/8514 362/255

(Continued)

FOREIGN PATENT DOCUMENTS

EP 2360749 A2 8/2011
WO 2012006123 A2 1/2012

(Continued)

OTHER PUBLICATIONS

International search report issued for the corresponding patent application No. PCT/EP2022/066952, dated Sep. 30, 2022, 4 pages (for informational purposes only).

*Primary Examiner* — Vincent Wall
(74) *Attorney, Agent, or Firm* — Viering, Jentschura & Partner mbB

(57) ABSTRACT

An optoelectronic semiconductor element includes a semiconductor chip for generating electromagnetic radiation. The chip includes: a radiation decoupling surface through which first electromagnetic radiation is emitted in a first wavelength range during operation and a conversion layer which is disposed directly on the radiation decoupling surface of the semiconductor chip. The conversion layer completely covers the radiation decoupling surface and has a main surface which is opposite the radiation decoupling surface. The conversion layer includes at least one luminescent substance which is designed to convert at least a portion the of first electromagnetic radiation into second electromagnetic radiation of a second wavelength range, wherein the second wavelength range is different from the first wavelength range. An optical feedback element is disposed directly on the main surface of the conversion layer and is (Continued)

designed to reflect at least a portion of the first and/or the second electromagnetic radiation.

12 Claims, 2 Drawing Sheets

(56) References Cited

U.S. PATENT DOCUMENTS

| | | | | |
|---|---|---|---|---|
| 2006/0289886 | A1* | 12/2006 | Sakai | H10H 20/835<br>257/E33.068 |
| 2007/0284567 | A1 | 12/2007 | Pokrovskiy et al. | |
| 2014/0077246 | A1* | 3/2014 | Bhat | H10H 20/018<br>257/98 |
| 2019/0097099 | A1* | 3/2019 | Guo | H10H 20/8512 |

FOREIGN PATENT DOCUMENTS

| | | | |
|---|---|---|---|
| WO | 20170069964 | A1 | 4/2017 |
| WO | 20190209708 | A1 | 10/2019 |

* cited by examiner

OPTOELECTRONIC SEMICONDUCTOR ELEMENT AND OPTOELECTRONIC COMPONENT

CROSS-REFERENCE TO RELATED APPLICATIONS

The present application is a U.S. National Stage Application of International Application PCT/EP2022/066952, filed Jun. 22, 2022, and claims the priority of the German patent application DE 10 2021 119 003.7 of Jul. 22, 2021; the entire disclosures of the above-listed applications are hereby explicitly incorporated by reference.

FIELD

Various embodiments relate to an optoelectronic semiconductor element and an optoelectronic component.

SUMMARY

At least one object of certain embodiments of the present disclosure is to provide an optoelectronic semiconductor element and an optoelectronic component with improved emission characteristic.

This can be solved by a subject-matter according to the independent patent claims. Embodiments and developments of the subject-matter can be characterized in the dependent claims and are further apparent from the following description and the drawings.

According to an embodiment of the present disclosure, the optoelectronic semiconductor element comprises a semiconductor chip for generating electromagnetic radiation.

The semiconductor chip is, for example, a light-emitting diode. The semiconductor chip comprises a semiconductor layer sequence, which in particular comprises an active layer for generating electromagnetic radiation. The semiconductor chip may be a surface emitter, for example a thin-film chip, in which a majority of the emission, for example at least 90% of the emission, occurs through a main surface of the semiconductor chip. Alternatively, the semiconductor chip can also be a volume emitter, in which a part of the emission, for example at least 30% of the emission, occurs through side surfaces of the semiconductor chip.

The semiconductor layer sequence may comprise a nitride compound semiconductor material. Nitride compound semiconductor materials are compound semiconductor materials that contain nitrogen, such as for example the materials from the system $In_xAl_yGa_{1-x-y}N$ with $0 \leq x \leq 1$, $0 \leq y \leq 1$ and $x+y \leq 1$. Thereby, this material does not necessarily comprise a mathematically exact composition according to the above formula. Rather, it may comprise one or more dopants and additional components, for example. For the sake of simplicity, however, the above formula only contains the essential components of the crystal lattice (Al, Ga, In, N), even if these may be partially replaced and/or supplemented by small amounts of other substances.

According to a further embodiment, the semiconductor chip comprises a radiation outcoupling surface via which a first electromagnetic radiation is emitted in a first wavelength range during operation. In the case of a surface emitter, the radiation outcoupling surface corresponds, for example, to a main surface of the semiconductor layer sequence, which is arranged parallel to the layers of the semiconductor layer sequence. The first electromagnetic radiation emitted during operation is, for example, light, such as, in the visible spectral range. The first wavelength range of the first electromagnetic radiation emitted during operation may comprise short-wavelength light, for example blue and/or ultraviolet light.

According to a further embodiment, the optoelectronic semiconductor element comprises a conversion layer which is arranged directly on the radiation outcoupling surface of the semiconductor chip. The semiconductor chip and the conversion layer can be in direct contact with each other in places. In particular, the first electromagnetic radiation emitted by the radiation outcoupling surface of the semiconductor chip may enter the conversion layer completely.

According to a further embodiment, the conversion layer completely covers the radiation outcoupling surface and comprises a main surface opposite the radiation outcoupling surface. The main surface of the conversion layer is arranged, for example, parallel to the radiation outcoupling surface of the semiconductor chip. In particular, the main surface of the conversion layer is configured to outcouple electromagnetic radiation from the conversion layer.

According to a further embodiment, the conversion layer comprises at least one phosphor configured to convert at least a part of the first electromagnetic radiation into a second electromagnetic radiation of a second wavelength range.

The phosphor may comprise, for example, one or more of the following materials: rare earth and alkaline earth metal garnets, nitrides, nitridosilicates, siones, sialones, aluminates, oxides, halophosphates, orthosilicates, sulfides, vandates and chlorosilicates. Further, the phosphor may additionally or alternatively comprise an organic material which may be selected from a group comprising perylenes, benzopyrenes, coumarins, rhodamines and azo dyes. The phosphor may, for example, be contained in a transparent matrix material, which may be formed by a plastic, a silicone, a glass, a ceramic material or a combination thereof. Hereby, a so-called phosphor platelet can be formed as conversion layer, which can be prefabricated and therefore self-supporting or which can be formed by applying to the main surface. Furthermore, the phosphor can be applied to a transparent substrate, such as a glass or ceramic substrate. In addition, it is also possible for a ceramic phosphor to form a self-supporting ceramic component that forms the conversion layer.

According to a further embodiment, the second wavelength range is different from the first wavelength range. For example, the second wavelength range comprises light with longer wavelengths than the first wavelength range. In particular, the second wavelength range comprises a wider bandwidth than the first wavelength range. For example, the first wavelength range comprises blue light, while the second wavelength range comprises blue to red light.

According to a further embodiment, the optoelectronic semiconductor element comprises an optical feedback element which is arranged directly on the main surface of the conversion layer.

According to a further embodiment, the optical feedback element is configured to reflect at least a part of the first and/or the second electromagnetic radiation. In particular, at least a part of the first electromagnetic radiation, which is emitted by the semiconductor chip and cannot be converted but can be scattered when passing through the conversion layer, is reflected by the optical feedback element back into the conversion layer. Furthermore, for example, at least a part of the second electromagnetic radiation emitted by the phosphor within the conversion layer is reflected back into the conversion layer by the optical feedback element.

In particular, the optical feedback element is configured to increase a mean optical path length of the first electromagnetic radiation and/or the second electromagnetic radiation in the conversion layer. Compared to an optoelectronic semiconductor element without an optical feedback element, this makes it possible for the conversion layer to comprise a smaller thickness for the same mean optical path length. A thickness of the conversion layer refers here and in the following to an extension of the conversion layer between the radiation outcoupling surface of the semiconductor chip on which the conversion layer is arranged and the main surface of the conversion layer. In particular, the thickness indicates an extension in a direction parallel to the surface normal of the main surface of the conversion layer.

According to a further embodiment, the optical feedback element comprises a plurality of openings through which regions of the main surface of the conversion layer are exposed. The features described here and in the following for an opening may apply to all openings. However, the features may also differ for different openings. For example, the shape of an opening comprises a circular, oval, square or rectangular shape in plan view. Furthermore, an opening with any curved and/or polygonal shape is possible. A lateral extension of an opening is may be greater than a thickness of the optical feedback element. Here and in the following, lateral refers to a direction that extends parallel to the main surface of the conversion layer. For example, a lateral extent of an opening is between 10 micrometers and 50 micrometers, both inclusive. Furthermore, the plurality of openings may be arranged in any desired manner. For example, the openings form a periodic or an aperiodic arrangement.

The angular distribution of the electromagnetic radiation emitted by the optoelectronic semiconductor element can be changed by suitably selecting, for example, the number and lateral extent of the plurality of openings. In particular, the optical feedback element is configured to cause an increased lateral emission of the optoelectronic semiconductor element during operation. In other words, the optical feedback element deflects at least a part of the electromagnetic radiation coupled out from the main surface of the conversion layer during operation to larger emission angles. The redirected electromagnetic radiation is, for example, at least partially outcoupled via side surfaces of the conversion layer. Here and in the following, the emission angle always refers to a surface normal to the main surface of the conversion layer from which the electromagnetic radiation generated during operation is outcoupled. Thus, is can, for example, be refrained from applying a relatively thick, translucent potting cap with a low reflectance to the conversion layer to increase the side emission. In particular, the optical feedback element allows increased side emission with a relatively thin design of the optoelectronic semiconductor element. Thin optoelectronic semiconductor elements with increased side emission are particularly advantageous for backlighting display devices with many local dimming ranges.

According to an embodiment, the optoelectronic semiconductor element comprises the following features:

- a semiconductor chip for generating electromagnetic radiation, which comprises a radiation outcoupling surface via which a first electromagnetic radiation is emitted in a first wavelength range during operation, and
- a conversion layer which is arranged directly on the radiation outcoupling surface of the semiconductor chip, wherein
  - the conversion layer completely covers the radiation outcoupling surface and comprises a main surface opposite the radiation outcoupling surface, wherein
  - the conversion layer comprises a phosphor configured to convert at least part of the first electromagnetic radiation into a second electromagnetic radiation of a second wavelength range, wherein
  - the second wavelength range is different from the first wavelength range, and
- an optical feedback element arranged directly on the main surface of the conversion layer, wherein
  - the optical feedback element is configured to reflect at least a part of the first and/or the second electromagnetic radiation, and
  - the optical feedback element comprises a plurality of openings through which regions of the main surface of the conversion layer are exposed.

One idea of the optoelectronic semiconductor element described herein is to achieve a wide emission characteristic with increased side emission compared to a Lambert radiator with the thinnest possible design. In particular, the emission characteristic can be adjusted, for example, by selecting the number and lateral extent of the openings in the optical feedback element. The optoelectronic semiconductor element described herein is suitable for backlighting display devices, for example. In particular, local dimming regions can be illuminated as homogeneously as possible.

According to a further embodiment, the optical feedback element comprises a reflective metallic layer. For example, the optical feedback element may comprise a reflective metallic layer sequence. The metallic layer or the metallic layer sequence is configured to reflect at least a part of the first and/or the second electromagnetic radiation back into the conversion layer. The metallic layer comprises, for example, gold, aluminum, silver or other metals and alloys thereof. In at least some cases, the metallic layer or the metallic layer sequence comprises a reflectivity greater than or equal to 50% for first and/or second electromagnetic radiation.

According to a further embodiment, the reflectivity of the reflective metallic layer is greater than 75%. In particular, more than 75% of the first and/or the second electromagnetic radiation incident on the reflective metallic layer is reflected back into the conversion layer. The reflectivity can be adjusted, for example, by a suitable choice of material and/or thickness of the metallic layer. In particular, the thickness of the reflective metallic layer is less than a lateral extension of the openings in the metallic layer, through which regions of the main surface of the conversion layer are exposed.

According to a further embodiment, the optical feedback element comprises a dielectric Bragg reflector. The dielectric Bragg reflector comprises at least one dielectric layer pair, wherein the two layers of a layer pair comprise different refractive indices. In particular, the dielectric Bragg reflector is configured to reflect electromagnetic radiation in a specific wavelength range.

According to a further embodiment, a reflectivity maximum of the dielectric Bragg reflector lies in the first wavelength range of the first electromagnetic radiation. In particular, the dielectric Bragg reflector comprises a reflectivity maximum at a wavelength of the incident electromagnetic radiation which corresponds, for example, to four times of an optical thickness of layers of the dielectric Bragg reflector.

By selecting the reflectivity maximum in the first wavelength range, the first electromagnetic radiation can be reflected by the dielectric Bragg reflector. Thus, the mean optical path length of the first electromagnetic radiation in the conversion layer can be greater than the mean optical path length of the second electromagnetic radiation in the conversion layer. In particular, this changes the color perception of the optoelectronic semiconductor element. In particular, the portion of short-wave light, for example blue, light emitted by the optoelectronic semiconductor element is reduced.

According to a further embodiment, the reflectivity of the dielectric Bragg reflector at the reflectivity maximum is greater than 75%. On the one hand, the reflectivity can be adjusted by suitable selection of the refractive indices of the at least one pair of layers of the dielectric Bragg reflector. On the other hand, the reflectivity is determined by the number of layer pairs. Furthermore, the width of the wavelength window within which the dielectric Bragg reflector has a strong reflective effect can be set by suitable selection of the refractive indices. For example, the dielectric Bragg reflector can be designed in such a way that it only strongly reflects first electromagnetic radiation in the first wavelength range. In contrast, second electromagnetic radiation in the second wavelength range, for example, is weakly reflected. This increases the mean optical path length of the first electromagnetic radiation within the conversion layer. The optical feedback element thus increases a degree of conversion of the first electromagnetic radiation. Thus, the optical feedback element allows a thinner design of the optoelectronic semiconductor element with a similar or the same degree of conversion as an optoelectronic semiconductor element without an optical feedback element.

According to a further embodiment, the openings of the optical feedback element are configured to outcouple at least a part of the first electromagnetic radiation and at least a part of the second electromagnetic radiation.

The angular distribution of the electromagnetic radiation emitted by the optoelectronic semiconductor element during operation can be changed by suitably selecting, for example, the number and lateral extent of the openings. In particular, the combination of back-reflection of electromagnetic radiation generated during operation at the optical feedback element and scattering of the electromagnetic radiation within the conversion layer causes portions of the electromagnetic radiation generated during operation to be redistributed from small emission angles to larger emission angles. The openings in the optical feedback element lead in particular to reduced forward emission and thus to increased side emission from the optoelectronic semiconductor element. Here and in the following, forward emission refers to a direction parallel to the surface normal of the main surface of the conversion layer, which points away from the radiation outcoupling surface of the semiconductor chip. In particular, the degree of redistribution from small emission angles to large emission angles can be adjusted, for example, by the number, shape, lateral extent and arrangement of the openings in the optical feedback element.

According to a further embodiment, an area of the regions of the main surface of the conversion layer exposed by the plurality of openings comprises less than 70% and/or more than 5% of the main surface of the conversion layer. In other words, a degree of coverage of the main surface of the conversion layer is may be between 30% and 95%, both inclusive, wherein uncovered regions of the main surface of the conversion layer are exposed by the openings in the optical feedback element. The degree of coverage of the main surface of the conversion layer may be between 50% and 90%. Thus, between 10% and 50% of the main surface of the conversion layer may be uncovered by the openings.

According to a further embodiment, the plurality of openings form a periodic arrangement. In particular, the openings can be arranged at the nodes of a square lattice. Alternatively, other periodic arrangements are also possible, such as a right-angled, oblique-angled hexagonal or centered-rectangular grid. For example, the openings are arranged in such a way that the azimuthal distribution of the emitted electromagnetic radiation is as isotropic as possible with respect to an axis that is normal to the main surface of the conversion layer.

According to a further embodiment, the optical feedback element is configured in such a way that an emission characteristic of the optoelectronic semiconductor element does not follow the Lambertian distribution. In particular, the optical feedback element causes a redistribution of the electromagnetic radiation coupled out from the optoelectronic semiconductor element during operation from small emission angles to larger emission angles and thus to a deviation from the Lambertian distribution.

According to a further embodiment, the optical feedback element is configured such that an emission characteristic of the optoelectronic semiconductor element comprises a local minimum in an emission direction perpendicular to the main surface of the conversion layer. In particular, the emission characteristic indicates the intensity of the electromagnetic radiation emitted by the optoelectronic semiconductor element during operation as a function of the emission angle. For example, the emission characteristic shows a batwing structure, whereby most of the electromagnetic radiation generated during operation is not emitted in the forward direction, i.e. perpendicular to the main surface of the conversion layer, but at non-zero emission angles. For example, the emission characteristic comprises a maximum at emission angles between 30 degrees and 60 degrees and a local minimum in the forward direction at an emission angle of 0 degrees, whereby the intensity of the emitted electromagnetic radiation at the local minimum is, for example, more than 10% lower than at the maximum of the emission characteristic.

The optical feedback element with the plurality of openings can in particular be configured to generate an emission characteristic with a batwing structure. The combination of back-reflection of at least a part of the first and/or second electromagnetic radiation generated during operation into the conversion layer and scattering within the conversion layer leads in particular to reduced forward emission and thus to increased side emission of the optoelectronic semiconductor element. By reducing the lateral extension of the openings and thus increasing the degree of coverage of the main surface of the conversion layer, for example, the forward emission of the optoelectronic semiconductor element can be reduced. Accordingly, the electromagnetic radiation deflected by scattering in the conversion layer can be coupled out in particular via side surfaces of the conversion layer, which results in increased side emission of the optoelectronic semiconductor element.

According to a further embodiment, an emitted intensity of the electromagnetic radiation in the local minimum is less than 75% of an emitted intensity of the electromagnetic radiation in an emission direction with maximum emitted intensity.

According to a further embodiment, during operation of the optoelectronic semiconductor element, at least a part of the first electromagnetic radiation and/or at least a part of the second electromagnetic radiation is coupled out via side surfaces of the conversion layer which are perpendicular or inclined to the main surface of the conversion layer. In particular, outcoupling of electromagnetic radiation generated during operation via the side surfaces of the conversion layer leads to increased side emission of the optoelectronic semiconductor element.

According to a further embodiment, the semiconductor chip is a flip chip. In particular, the radiation outcoupling surface of the semiconductor chip comprises no electrical contact points.

According to a further embodiment, the conversion layer comprises a thickness of less than 1 millimeter. In particular, an optical feedback element with a large degree of coverage of the main surface of the conversion layer increases the mean optical path length of the electromagnetic radiation in the conversion layer. Compared to an optoelectronic semiconductor element without an optical feedback element, a similar or equal degree of conversion of the first electromagnetic radiation can thus be achieved with a lower layer thickness of the conversion layer.

An optoelectronic device is also specified.

According to an embodiment, the optoelectronic device comprises at least one optoelectronic semiconductor element. In particular, the at least one optoelectronic semiconductor element comprises a semiconductor chip, a conversion layer and an optical feedback element. In particular, the optoelectronic device may comprise an optoelectronic semiconductor element as described herein. That is, all features described for the optoelectronic semiconductor element are also disclosed for the optoelectronic device and vice versa.

According to a further embodiment, the optical device comprises a reflective carrier with a main surface to which the at least one optoelectronic semiconductor element is applied. The carrier is configured in particular for electrical contacting of the optoelectronic semiconductor element. In at least some cases, the radiation outcoupling surface of the optoelectronic semiconductor element faces away from the carrier. The main surface of the carrier can, for example, comprise a reflective layer or a reflective layer sequence which reflects at least a part of the electromagnetic radiation generated by the optoelectronic semiconductor element during operation.

According to a further embodiment, the optoelectronic device comprises a frame with a reflective surface that is inclined towards the main surface of the carrier. The reflective surface of the frame comprises, for example, a metallic layer or a metallic layer sequence that reflects at least a part of the electromagnetic radiation generated by the optoelectronic semiconductor element during operation.

According to a further embodiment, the frame laterally completely surrounds the at least one optoelectronic semiconductor element. Here and in the following, with lateral is meant a direction that extends parallel to the main surface of the reflective carrier.

According to a further embodiment, the frame projects beyond the optoelectronic semiconductor element in a direction perpendicular to the main surface of the carrier.

According to a further embodiment, the optoelectronic semiconductor device comprises a diffuser arranged on the frame and covering the at least one optoelectronic semiconductor element. The diffuser comprises a light-transmissive material configured to scatter at least a part of the electromagnetic radiation generated by the optoelectronic semiconductor element during operation. The optical feedback element leads to an increased side emission of the optoelectronic semiconductor element and thus to a more homogeneous illumination of the diffuser by electromagnetic radiation generated during operation.

BRIEF DESCRIPTION OF THE DRAWINGS

Further embodiments and developments of the optoelectronic semiconductor element and the optoelectronic device are shown in the exemplary embodiments described below with reference to the figures.

Elements that are identical, similar or have the same effect are marked with the same reference signs in the figures. The figures and the proportions of the elements shown in the figures are not to be regarded as true to scale. Rather, individual elements, in particular layer thicknesses, may be shown in exaggerated size for better visualization and/or understanding.

Figure 1:
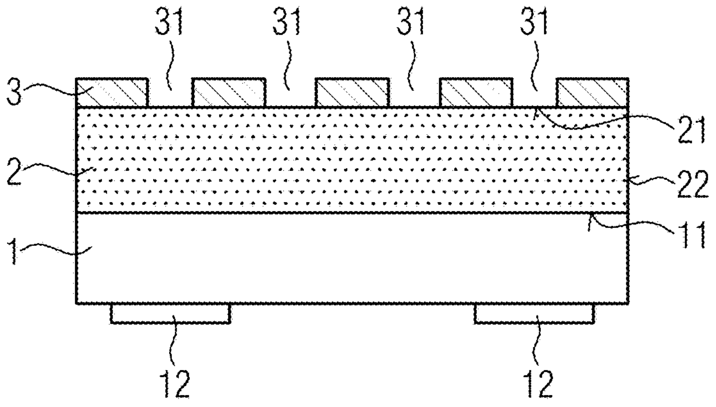
FIG. 1 shows a schematic sectional view of an optoelectronic semiconductor element according to an exemplary embodiment.

FIG. 1 shows a schematic sectional view of an optoelectronic semiconductor element according to an exemplary embodiment, which comprises a semiconductor chip 1, a conversion layer 2 and an optical feedback element 3. The semiconductor chip 1 comprises a radiation outcoupling surface 11, via which a first electromagnetic radiation in a first wavelength range is emitted during operation. The radiation outcoupling surface 11 may correspond to a main surface of the semiconductor chip 1. Furthermore, the optoelectronic semiconductor chip comprises electrical contact points 12, which can be arranged on a main surface of the semiconductor chip which is opposite the radiation outcoupling surface 11.

A conversion layer 2 comprising a phosphor is applied to the radiation outcoupling surface 11. The conversion layer 2 completely covers the radiation outcoupling surface 11 of the semiconductor chip 1. The phosphor is configured to convert at least a part of the first electromagnetic radiation 41 into a second electromagnetic radiation 42. The second electromagnetic radiation 42 comprises a second wavelength range which is different from the first wavelength range of the first electromagnetic radiation 41.

The conversion layer 2 comprises a main surface 21 on which an optical feedback element 3 is arranged. The optical feedback element 3 may comprise a reflective layer or a reflective layer sequence comprising a plurality of openings 31 through which regions of the main surface 21 of the conversion layer 2 are exposed. In particular, first and second electromagnetic radiation 41, 42 generated during operation is at least partially outcoupled from the optoelectronic semiconductor element via the openings 31. At least some of the first and second electromagnetic radiation 41, 42 generated during operation is also coupled out via side surfaces 22 of the conversion layer.

Figure 2:
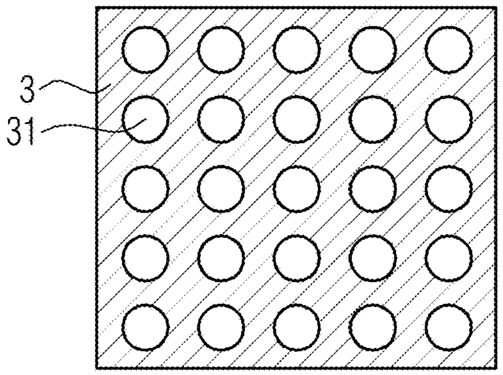
FIG. 2 shows a schematic top view of an optoelectronic semiconductor element according to an exemplary embodiment.

FIG. 2 shows a schematic top view of an optoelectronic semiconductor element according to an exemplary embodiment. In particular, the optical feedback element 3 comprises a plurality of circular openings 31 arranged in a periodic structure. The shape of the openings 31 is not limited to circular openings, rather the openings 31 may comprise any shape in plan view. Furthermore, the arrangement of the plurality of openings 31 is not limited to a periodic structure. Rather, the openings 31 can be arranged in any desired manner, for example also in an aperiodic structure.

In at least some instances, the sum of the areas of the openings 31 is between 10% and 50% of the main area 21 of the conversion layer 2. In other words, the optical feedback element 3 may cover between 50% and 90% of the main area 21 of the conversion layer 2, wherein the uncovered regions of the conversion layer 2 are exposed by the openings 31.

Figure 3:
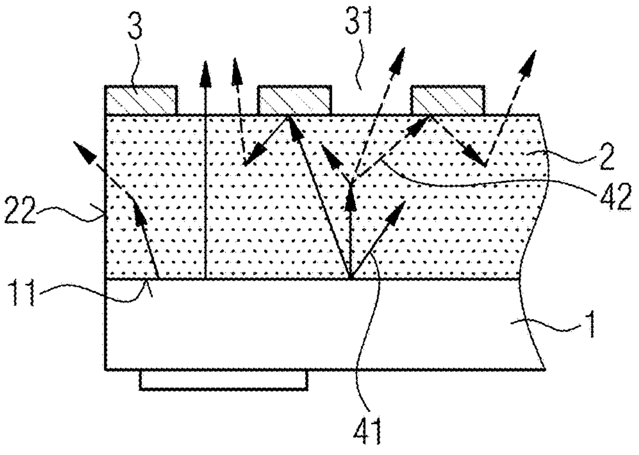
FIG. 3 shows a schematic sectional view of an optoelectronic semiconductor element according to an exemplary embodiment, wherein exemplary beam paths of first and second electromagnetic radiation are shown schematically.

FIG. 3 shows a schematic sectional view of an optoelectronic semiconductor element comprising a semiconductor chip 1, a conversion layer 2 and an optical feedback element 3. In particular, exemplary beam paths of first and second electromagnetic radiation 41, 42 generated during operation are shown. First electromagnetic radiation 41 is emitted from the main surface 11 of the semiconductor chip 1. At least a part of the first electromagnetic radiation 41 is scattered in the conversion layer 2 and/or converted by the phosphor into second electromagnetic radiation 42. At least a part of the first electromagnetic radiation 41 and/or the second electromagnetic radiation 42 is reflected back into the conversion layer 2 by the optical feedback element 3. This increases the mean optical path length of the first electromagnetic radiation 41 and/or the second electromagnetic radiation 42 in the conversion layer 2.

First and second electromagnetic radiation 41, 42 is at least partially coupled out via the openings 31 of the optical feedback element 3 and via the side surfaces 22 of the conversion layer 2. The optical feedback element 3 causes at least a part of the electromagnetic radiation coupled out by the optoelectronic semiconductor component to be redistributed from small emission angles to larger emission angles. This results in increased side emission from the optoelectronic semiconductor element. The emission characteristic 43 of the optoelectronic semiconductor element therefore no longer follows the Lambertian distribution. In particular, the emission characteristic 43 comprises a batwing structure, i.e. a larger portion of the outcoupled electromagnetic radiation is emitted at larger radiation angles than in a direction normal to the main surface 21 of the conversion layer 2.

Figure 4:
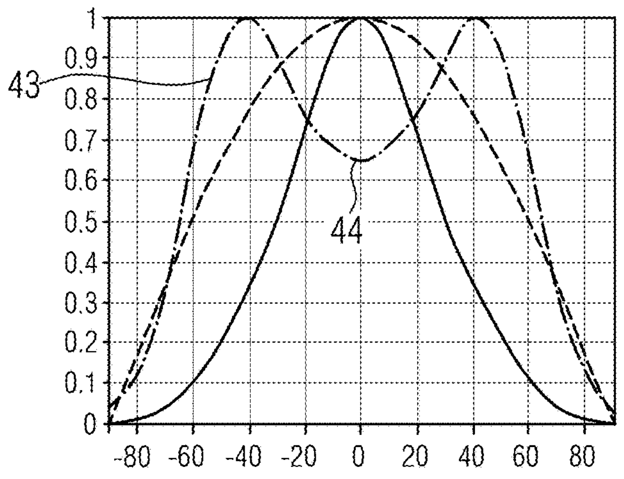
FIG. 4 shows exemplary emission characteristics of optoelectronic semiconductor components.

FIG. 4 shows schematic emission characteristics 43 of optoelectronic devices. In particular, the intensity of the electromagnetic radiation emitted during operation is shown as a function of the emission angle. The emission angle is defined with respect to the surface normal of the main surface 21 of the conversion layer 2. The dashed line corresponds to an emission characteristic that follows the Lambertian distribution, whereby the emitted intensity of the electromagnetic radiation decreases monotonically with the emission angle. The solid line shows an elliptical emission characteristic 43 of an optoelectronic semiconductor element with amplified emission in the forward direction, i.e. parallel to the surface normal of the main surface 21 of the conversion layer 2. In contrast, the dash-dotted line shows a schematic emission characteristic 43 according to an exemplary embodiment, which comprises a batwing structure. In particular, the emission characteristic 43 comprises a local minimum 44 in the forward direction.

Figure 5:
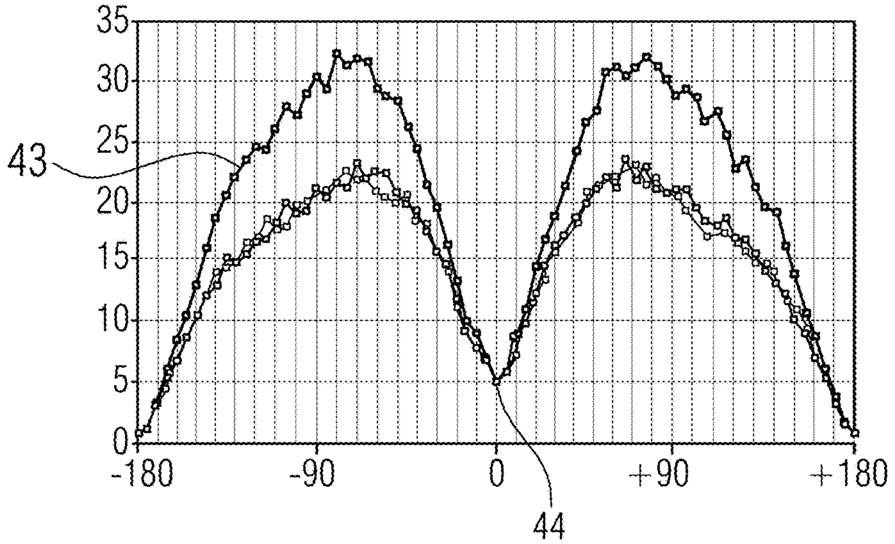
FIG. 5 shows emission characteristics of an optoelectronic semiconductor element according to an exemplary embodiment.

FIG. 5 shows numerically simulated emission characteristics 43 of an optoelectronic semiconductor element according to an exemplary embodiment. In particular, the emission characteristics 43 show a batwing structure with a local minimum of the intensity of the electromagnetic radiation emitted in operation in the forward direction, as well as maxima of the intensity at an emission angle of approximately 70 degrees. The intensity of the electromagnetic radiation emitted in the forward direction is approximately one-sixth of the intensity at an emission angle with maximum emitted intensity.

Figure 6:
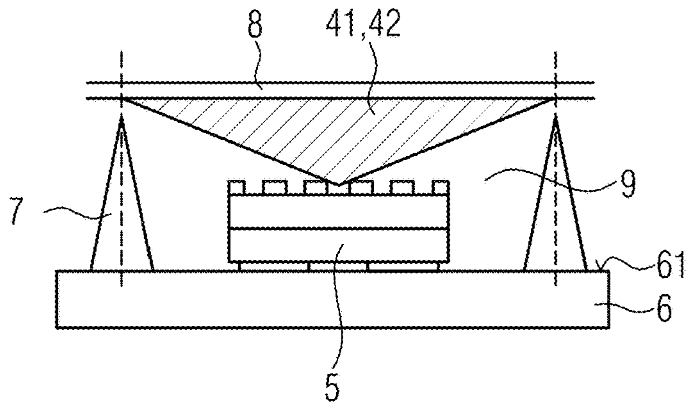
FIG. 6 shows a sectional view of an optoelectronic device according to an exemplary embodiment.

FIG. 6 shows a schematic sectional view of an optoelectronic device according to an exemplary embodiment. The optoelectronic device comprises an optoelectronic semiconductor element 5, which is arranged on a main surface 61 of a carrier 6. The carrier 6 may comprise a reflective main surface 61 and is configured for electrical contacting of the optoelectronic semiconductor element 5. The optoelectronic semiconductor element comprises a surface-emitting semiconductor chip, a conversion layer and an optical feedback element applied thereto according to an exemplary embodiment.

In the lateral direction, the optoelectronic semiconductor element is completely surrounded by a frame 7 comprising a reflective surface. In particular, the frame 7 projects beyond the optoelectronic semiconductor element 5 in a direction parallel to the surface normal of the main surface 61 of the carrier 6. A diffuser 8 is arranged on the frame 7, which completely covers the optoelectronic semiconductor element 5. The diffuser 8 comprises a translucent material and is configured to scatter first and second electromagnetic radiation 41, 42 generated during operation, which is coupled out from the optoelectronic device via the diffuser 8. A cavity 9 is formed between the carrier 6, the frame 7 and the diffuser 8, within which the optoelectronic semiconductor element 5 is arranged.

This patent application claims the priority of the German patent application 102021119003.7, the disclosure content of which is hereby incorporated by reference.

The present disclosure is not limited to the exemplary embodiments by the description thereof. Rather, the present disclosure includes any new feature as well as any combination of features, which includes in particular any combination of features in the patent claims, even if this feature or combination itself is not explicitly stated in the patent claims or exemplary embodiments.

LIST OF REFERENCE SIGNS

1 semiconductor chip
11 radiation outcoupling surface
12 contact point
2 conversion layer
21 main surface of the conversion layer
22 side surface
3 optical feedback element
31 openings
41 first electromagnetic radiation
42 second electromagnetic radiation
43 emission characteristic
44 local minimum
5 optoelectronic semiconductor element
6 carrier
61 main surface of the carrier
7 frame
8 diffuser
9 cavity

The invention claimed is:

1. An optoelectronic semiconductor element comprising:

a semiconductor chip for generating electromagnetic radiation, which comprises a radiation outcoupling surface through which a first electromagnetic radiation is emitted in a first wavelength range during operation, and a conversion layer which is arranged directly on the radiation outcoupling surface of the semiconductor chip, wherein the conversion layer completely covers the radiation outcoupling surface and comprises a main surface opposite of the radiation outcoupling surface, wherein the conversion layer comprises at least one phosphor configured to convert at least a part of the first electromagnetic radiation into a second electromagnetic radiation of a second wavelength range, wherein the second wavelength range is different from the first wavelength range, and an optical feedback element arranged directly on the main surface of the conversion layer, wherein the optical feedback element is configured to reflect at least a part of the first and/or the second electromagnetic radiation, the optical feedback element comprises a plurality of openings through which regions of the main surface of the conversion layer are exposed, the optical feedback element comprises a dielectric Bragg reflector, the second wavelength range comprises blue to red light, and a lateral extent of each opening is at least 10 micrometers and at most 50 micrometers.

2. The optoelectronic semiconductor element according to claim 1, wherein a reflectivity maximum of the dielectric Bragg reflector lies in the first wavelength range of the first electromagnetic radiation.

3. The optoelectronic semiconductor element according to claim 2, wherein the reflectivity of the dielectric Bragg reflector at the reflectivity maximum is greater than 75%.

4. The optoelectronic semiconductor element according to claim 1, wherein an area of the regions of the main surface of the conversion layer exposed by the plurality of openings comprises less than 70% and/or more than 5% of the main surface of the conversion layer.

5. The optoelectronic semiconductor element according to claim 1, wherein the plurality of openings form a periodic arrangement.

6. The optoelectronic semiconductor element according to claim 1, wherein the optical feedback element is configured such that an emission characteristic of the optoelectronic semiconductor element does not follow the Lambertian distribution.

7. The optoelectronic semiconductor element according to claim 6, wherein the optical feedback element is configured such that the emission characteristic of the optoelectronic semiconductor element comprises a local minimum in an emission direction perpendicular to the main surface of the conversion layer.

8. The optoelectronic semiconductor element according to claim 7, wherein an emitted intensity of the electromagnetic radiation in the local minimum is less than 75% of an emitted intensity of the electromagnetic radiation in an emission direction with maximum emitted intensity.

9. The optoelectronic semiconductor element according to claim 1, wherein during operation at least a part of the first electromagnetic radiation and/or at least a part of the second electromagnetic radiation is coupled out through side surfaces of the conversion layer which are perpendicular or inclined to the main surface of the conversion layer.

10. The optoelectronic semiconductor element according to claim 1, wherein the semiconductor chip is a flip chip.

11. The optoelectronic semiconductor element according to claim 1, wherein the conversion layer comprises a thickness of less than 1 millimeter.

12. An optoelectronic component comprising:

at least one optoelectronic semiconductor element according to claim 1, and a carrier with a main surface on which the at least one optoelectronic semiconductor element is applied, and a frame with a reflective surface inclined towards the main surface of the carrier, wherein the frame laterally completely surrounds the at least one optoelectronic semiconductor element, wherein the frame projects beyond the optoelectronic semiconductor element in a direction perpendicular to the main surface of the carrier, and a diffuser, which is arranged on the frame and covers the at least one optoelectronic semiconductor element, so that a cavity is formed between the carrier, the frame and the diffuser, in which the optoelectronic semiconductor element is arranged.

* * * * *